(12) United States Patent
Levine et al.

(10) Patent No.: US 8,178,914 B2
(45) Date of Patent: May 15, 2012

(54) METHOD OF FABRICATING BACK-ILLUMINATED IMAGING SENSORS

(75) Inventors: Peter Alan Levine, West Windsor, NJ (US); Pradyumna Kumar Swain, Princeton, NJ (US); Mahalingam Bhaskaran, Princeton, NJ (US)

(73) Assignee: SRI International, Menlo Park, CA (US)

( * ) Notice: Subject to any disclaimer, the term of this patent is extended or adjusted under 35 U.S.C. 154(b) by 415 days.

(21) Appl. No.: 12/579,623

(22) Filed: Oct. 15, 2009

(65) Prior Publication Data

US 2010/0032783 A1 Feb. 11, 2010

Related U.S. Application Data

(62) Division of application No. 12/020,640, filed on Jan. 28, 2008, now Pat. No. 7,622,342.

(60) Provisional application No. 60/908,199, filed on Mar. 27, 2007.

(51) Int. Cl.
*H01L 31/062* (2006.01)
*H01L 31/113* (2006.01)

(52) U.S. Cl. ............ 257/292; 257/288; 257/E21.189; 257/E21.177; 257/E21.229; 257/E21.352

(58) Field of Classification Search .......... 257/288, 257/291, 292, 204, 69, 57, E21.177, E21.189, 257/E21.229, E21.352
See application file for complete search history.

(56) References Cited

U.S. PATENT DOCUMENTS

| 5,227,313 | A | 7/1993 | Gluck et al. |
| 5,270,221 | A | 12/1993 | Garcia et al. |
| 6,498,073 | B2 | 12/2002 | Sarma et al. |
| 7,067,853 | B1 | 6/2006 | Yao et al. |
| 7,238,583 | B2 | 7/2007 | Swain et al. |
| 7,541,256 | B2 | 6/2009 | Swain et al. |
| 7,622,342 | B2 * | 11/2009 | Swain et al. ............ 438/199 |
| 2006/0076590 | A1 | 4/2006 | Pain et al. |
| 2006/0186560 | A1 | 8/2006 | Swain et al. |
| 2006/0197007 | A1 | 9/2006 | Iwabuchi et al. |

* cited by examiner

*Primary Examiner* — David Nhu
(74) *Attorney, Agent, or Firm* — Lowenstein Sandler PC

(57) ABSTRACT

A method for fabricating a back-illuminated semiconductor imaging device on a semiconductor-on-insulator substrate is disclosed. The substrate includes an insulator layer and an epitaxial layer overlying the insulator layer. A bond pad region is formed extending into the epitaxial layer to a surface of the insulator layer. A bond pad is fabricated partially overlying the bond pad region. At least one imaging component is fabricated partially overlying and extending into the epitaxial layer. A passivation layer is fabricated overlying the epitaxial layer, the bond pad, and the at least one imaging component. A handle wafer is bonded to the passivation layer. A portion of the insulator layer and a portion of the bond pad region is etched to expose a portion of the bond pad.

11 Claims, 5 Drawing Sheets

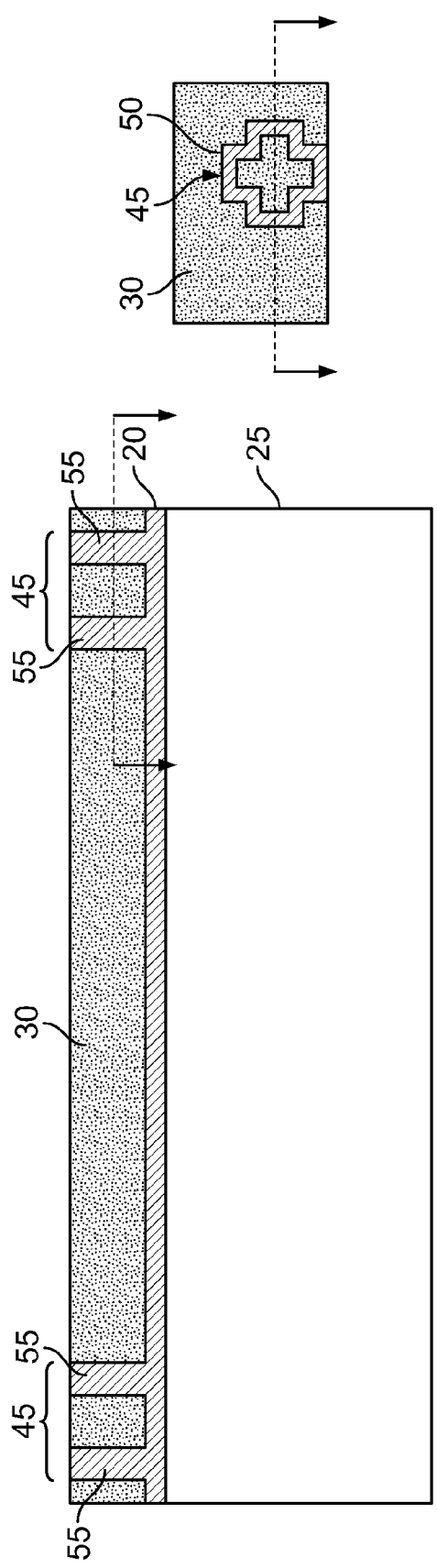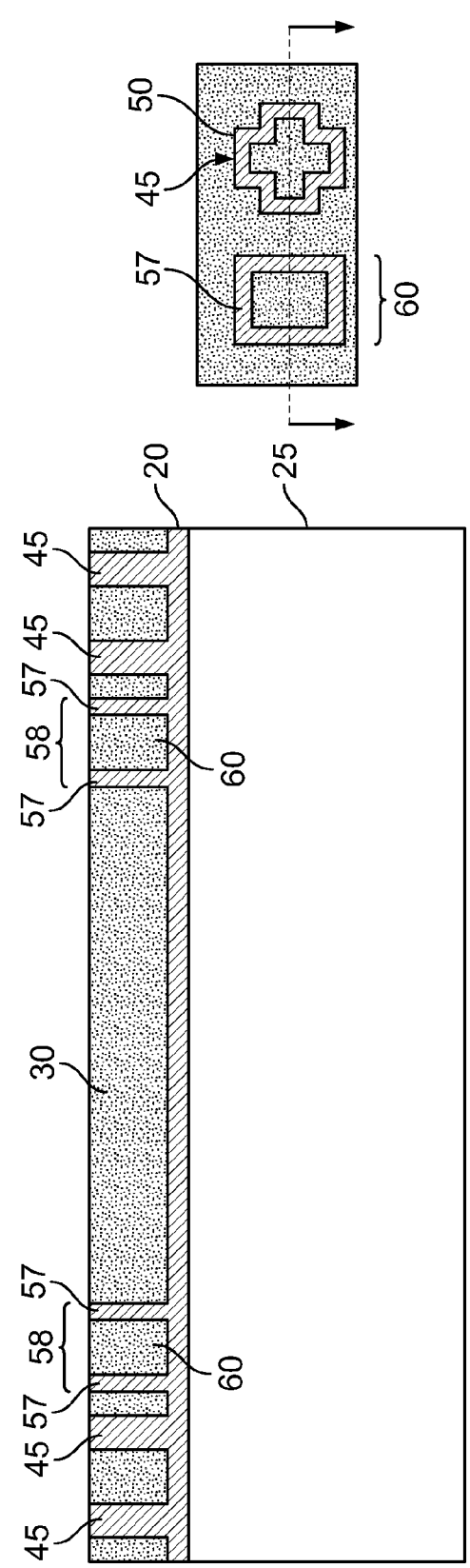

METHOD OF FABRICATING BACK-ILLUMINATED IMAGING SENSORS

CROSS-REFERENCE TO RELATED APPLICATIONS

This application is a divisional application of U.S. utility patent application Ser. No. 12/020,640 filed Jan. 28, 2008, now U.S. Pat. No. 7,622,342, which claims the benefit of U.S. provisional patent application No. 60/908,199 filed Mar. 27, 2007, the disclosures of which are incorporated herein by reference in their entirety.

FIELD OF THE INVENTION

The field of the present invention is semiconductor device fabrication and device structure. More specifically, the present invention relates to a back-illuminated image array device and a method of constructing such a device.

BACKGROUND OF THE INVENTION

CMOS or CCD image sensors are of interest in a wide variety of sensing and imaging applications in a wide range of fields including consumer, commercial, industrial, and space electronics. Imagers based on charge coupled devices (CCDs) are currently the most widely utilized. CCDs are employed either in front or back-illuminated configurations. Front-illuminated CCD imagers are cost effective to manufacture compared to back-illuminated CCD imagers such that front-illuminated devices dominate the consumer imaging market. Front side illumination, while traditionally utilized in standard imagers, has significant performance limitations such as low fill factor/low sensitivity. The problem of low fill factor/low sensitivity is typically due to shadowing caused by the presence of opaque metal bus lines, and absorption by the array circuitry structure formed on the front surface in the pixel region. Thus, the active region of the pixel is typically very small (low fill factor) in large format (high-resolution) front-illuminated imagers.

Thinned, back-illuminated, imaging devices are advantageous over front-illuminated imagers for high fill factor and better overall efficiency of charge carrier generation and collection. One goal of the performance of back-illuminated, semiconductor imaging devices is that the charge carriers generated by light or other emanation incident on the backside should be driven to the front side quickly to avoid any horizontal drift, which may smear the image. It is also desirable to minimize the recombination of the generated carriers before they reach the front side, since such recombination reduces overall efficiency and sensitivity of the device.

These desires may be achieved by providing a thin semiconductor layer and a high electric field within this layer. The field should extend to the back surface, so that the generated carriers, such as electrons or holes, can be driven quickly to the front side. This requires additional treatment at the backside of the device, which adds to the complexity of the fabrication process. One current technique includes chemical thinning of semiconductor wafers and deposition of a "flash gate" at the backside after thinning. This requires critical thickness control of the backside flash gate. Another technique involves growth of a thin dopant layer on a wafer back using molecular beam epitaxy (MBE). Still another known method used to provide a desired electric field is to create a gradient of doping inside the thinned semiconductor layer by backside implant of the layer followed by appropriate heat treatment for annealing and activation. These methods can not be easily included in conventional semiconductor foundry processing, and require more expensive custom processing.

Fabrication of thinned back-illuminated imagers has other challenges: For example, thinned back-illuminated imagers can have inherent dangling bonds present at the silicon back surface, which may cause generated electrons to recombine at the back surface. Therefore, quantum efficiency (QE) can be degraded if the backside of the thinned imager is not treated to reduce traps. Thinning of wafers poses yield issues such as stress in the thinned wafer, and uniformity of thickness. For these and the above reasons, fabrication cost is much higher for high volume production of back-illuminated imagers than for front-illuminated imagers.

A cost effective process for manufacturing silicon-on-insulator (SOI) based back-illuminated CCD/CMOS imagers is proposed in commonly owned U.S. patent application Ser. No. 11/350,546 filed Feb. 9, 2006, now U.S. Pat. No. 7,238,583, the disclosure of which is incorporated herein by reference in its entirety. The fabrication method proposed in that application not only solves the above mentioned problems, but also had several advantages over other proposals for back-illuminated CCD/CMOS imagers, including:

- The proposed method is fully compatible with existing CCD/CMOS imager foundry processes.
- The proposed method has no need for any special backside treatment.
- The buried oxide layer of the SOI wafers acts as a natural stopping layer for a high throughput thinning process.
- The thickness of epitaxial layer grown using this process is precisely controlled. This, in conjunction with the natural stopping oxide insulating layer of the SOI, can result in highly uniform thickness as compared to conventional approaches.
- The proposed method allows for multi-level metal processing.
- Devices manufactured using the proposed method can be fully tested before applying the steps of wafer thinning/lamination, which results in major cost reductions in a production environment.

Some imaging systems incorporate color filters and micro-lenses into the image sensors to produce wavelength dependent signals. To date, this has been done mostly with front-illuminated imagers. Fabrication of color filters and micro-lens for thinned back-illuminated imagers, even for the method proposed above, is a complex process. Alignment of color filters/micro-lenses on the backside to the pixels in the front side is very critical. Back to front alignment is possible, but with less degree of alignment accuracy. Apart from that, wire bonding and packaging of such back thinned imagers with color filters and micro-lenses add to complexity of the process.

Accordingly, what would be desirable, but has not yet been provided, is a device and method for fabricating back-illuminated imagers which can cost-effectively incorporate color filters, micro-lenses, and wire bonding techniques.

SUMMARY OF THE INVENTION

Disclosed is a method and resulting device for back-illuminated imaging device employing Semiconductor-on-insulator (SOI) substrates. The method for manufacturing the imaging device includes the steps of providing a substrate comprising an insulator layer, and an epitaxial layer substantially overlying the insulator layer; forming at least one bond pad region extending into the epitaxial layer to a surface of the insulator layer; fabricating at least one bond pad at least partially overlying the at least one bond pad region; fabricating at least one imaging component at least partially overlying and extending into the epitaxial layer; fabricating a passivation layer substantially overlying the epitaxial layer, the at least one bond pad, and the at least one imaging component; bonding a handle wafer to the passivation layer; and etching through at least a portion of the insulator layer and at least a portion of the bond pad region to expose at least a portion of the at least one bond pad.

The alignment keys in the epitaxial layer are formed by printing key patterns on a top portion of the epitaxial layer; etching the underlying epitaxial layer below the key patterns using a trench etch process until the etched away silicon is stopped by the underlying insulator/buried oxide layer; and filling the opened trenches with an oxide of silicon. The at least one bond pad for attaching a bond wire is etched in the epitaxial layer at a location proximal to the alignment keys. A handle wafer is attached or bonded to a flat surface on the passivation layer by gluing the handle wafer to the flat surface or by bonding pyrex glass to the flat surface using anodic bonding and then bonding the handle wafer to the pyrex glass.

The resulting back-illuminated semiconductor imaging device comprises an insulator layer; an epitaxial layer substantially overlying the insulator layer; at least one bond pad region extending into the epitaxial layer to a surface of the insulator layer, the at least one bond pad region being formed in the insulator layer and the epitaxial layer, the bond pad region having an inner open region extending at least partially therethrough, thereby forming sidewalls in the at least one bond pad region; at least one bond pad substantially overlying the bond pad region; at least one imaging component formed at least partially overlying and extending into the epitaxial layer; a passivation layer formed substantially overlying the epitaxial layer, the at least one imaging component, and the at least one bond pad; and a handle wafer bonded to the passivation layer. A plurality of alignment keys are formed in the epitaxial layer. At least one optical component is bonded to the insulator layer, which can include color filters and microlenses, in any combination. The imaging components can include CMOS imaging components, charge-coupled device (CCD) components, photodiodes, avalanche photodiodes, or phototransistors, in any combination.

SUMMARY DESCRIPTION OF THE DRAWINGS

FIG. 3 shows the step of forming alignment keys in the epitaxial layer, according to an embodiment of the present invention;

FIG. 4 shows the step of printing and etching bond pad regions in the epitaxial layer at locations near the alignment keys of FIG. 3;

DETAILED DESCRIPTION OF THE INVENTION

The following embodiments are intended as exemplary, and not limiting. In keeping with common practice, figures are not necessarily drawn to scale.

Figure 1:
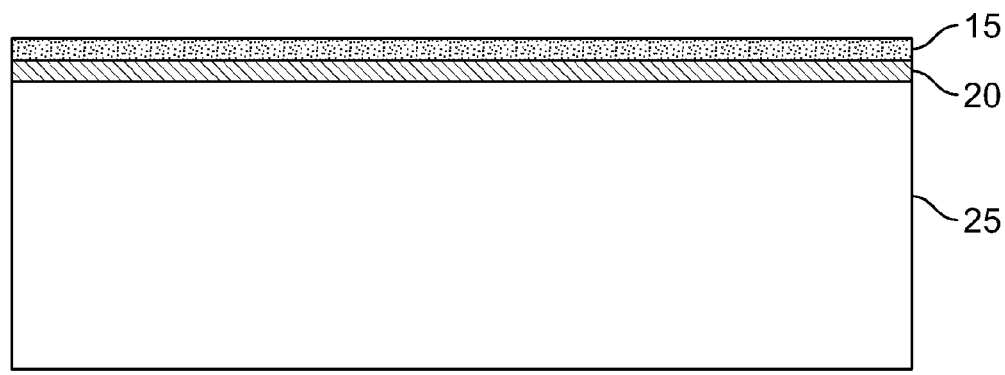
FIG. 1 shows an ultra-thin silicon-on-insulator (SOI) substrate employed in a process for fabricating a back-illuminated imaging device, according to an embodiment of the present invention.

FIGS. 1-10 illustrate an embodiment of a process for manufacturing thinned back-illuminated imagers and a resulting structure. FIG. 1 illustrates initial substrate 10 sometimes referred to in the art as an semiconductor-on-insulator (SOI) substrate. Starting SOI substrate 10, shown in FIG. 1, is composed of handle wafer 25 to provide mechanical support during processing, an insulator layer 20 (which can be, for example, a buried oxide layer of silicon), and seed layer 15. In the present embodiment, the handle wafer 25 may be a standard silicon wafer used in fabricating integrated circuits. Alternatively, the handle wafer 25 may be any sufficiently rigid substrate composed of a material which is compatible with the steps of the method disclosed herein. Insulator layer 20 may comprise an oxide of silicon with a thickness of about 1 micrometer. Among other embodiments, the thickness of insulator layer 20 may fall in a range from about 10 nm to about 5000 nm. Seed layer 15 may be comprised of crystalline silicon having a thickness from about 5 nanometers to about 100 nanometers.

SOI substrates are available commercially and are manufactured by various known methods. In one method, thermal silicon oxide is grown on silicon wafers. Two such wafers are joined with oxidized faces in contact and raised to a high temperature. In some variations, an electric potential difference is applied across the two wafers and the oxides. The effect of these treatments is to cause the oxide layers on the two wafers to flow into each other, forming a monolithic bond between the wafers. Once the bonding is complete, the silicon on one side is lapped and polished to the desired thickness of seed layer 15, while the silicon on the opposite side of the oxide forms handle wafer 25. The oxide forms insulator layer 20.

Another method of fabricating an SOI substrates begins with obtaining a more standard semiconductor-on-insulator (SOI) wafer in which the seed layer 15 has a thickness in the range from about 100 nm to about 1000 nm. A thermal oxide is grown on the semiconductor substrate, using known methods. As the oxide layer grows, semiconductor material of the semiconductor substrate is consumed. Then the oxide layer is selectively etched off, leaving a thinned semiconductor substrate having a desired SOI thickness.

SOI substrates manufactured by an alternative method, known as Smart Cut.™., are sold by Soitec, S.A.

Seed layer 15 may comprise silicon (Si), Germanium (Ge), SiGe alloy, a III-V semiconductor, a II-VI semiconductor, or any other semiconductor material suitable for the fabrication of optoelectronic devices.

Figure 2:
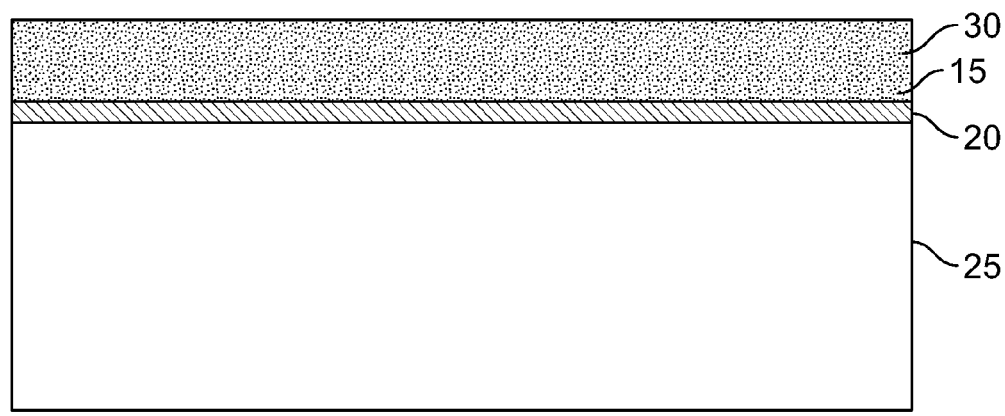
FIG. 2 shows the step of forming an epitaxial layer on the seed layer of the SOI substrate depicted in FIG. 1.

Referring now to FIG. 2, epitaxial layer 30 is formed on the seed layer 15, using seed layer 15 as the template. Depending on the material of seed layer 15, epitaxial layer 30 may comprise silicon (Si), Germanium (Ge), SiGe alloy, a III-V semiconductor, a II-VI semiconductor, or any other semiconductor material suitable for the fabrication of optoelectronic devices. Epitaxial layer 30 may have a thickness from about 1 micrometer to about 50 micrometers. The resistivity of the epitaxial layer 30 can be controlled by controlling the epitaxial growth process.

Referring now to FIG. 3, once epitaxial layer 30 is grown, alignment keys 45 are printed on and etched into the epitaxial layer 30. The alignment keys 45 can be used to align subsequent layers during the imager fabrication process and also can be used to align color filters on the backside after the wafers are thinned. The use of alignment keys can result in highly accurate alignment of about 0.1 micrometer or less for subsequently deposited layers. The alignment keys 45 can also be used to open bond pad regions for wire bonding to the backside of the resultant device. Using photolithography, key patterns 50 are printed on a top portion of the epitaxial layer 30. A trench etch process can be used to etch the underlying epitaxial layer 30 below the key patterns 50 to etch away silicon leaving behind the underlying insulator/buried oxide layer 20. The open trenches 55 are then filled with a suitable material such as an oxide of silicon, silicon carbide, silicon nitride, or poly-silicon. A chemical or mechanical polishing technique can be used to achieve a more planar epitaxial layer 30.

Referring now to FIG. 4, one or more trenches 57 around bond pad areas 58 are printed on and etched into the epitaxial layer 30 at appropriate locations. The alignment keys 45 can be used as reference levels for aligning the locations of the trenches 57 or the trenches 57 can be patterned and etched at the same time as the alignment keys 45 are printed and etched. The one or more open regions formed as a result of etching are then filled with an oxide of silicon to form the trenches 57 around the one or more bond pad regions 60.

Figure 5:
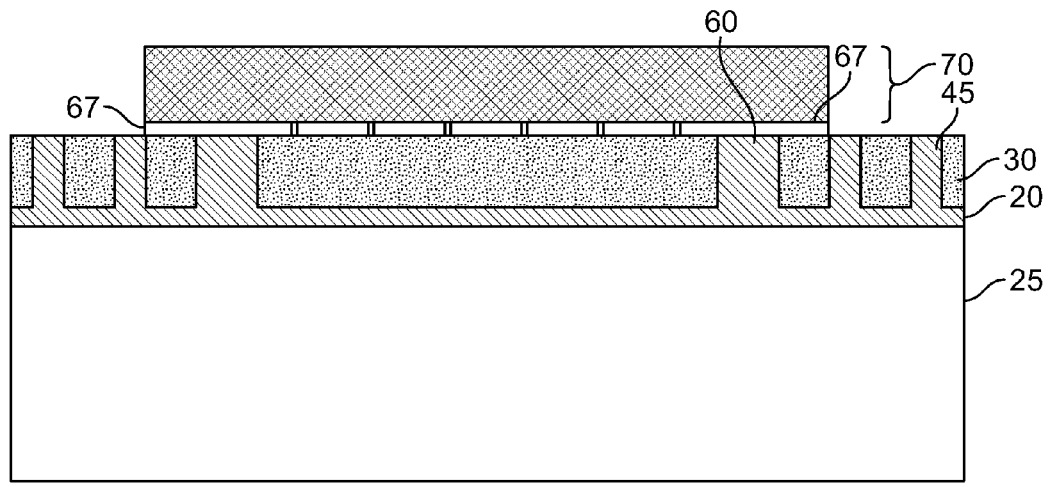
FIG. 5 shows the step of fabricating one or more imaging components on the epitaxial layer, according to an embodiment of the present invention.

Referring now to FIG. 5, one or more bond pads 67 may be formed substantially overlying the one or more bond pad regions 60. One or more imaging components 70 may be fabricated overlying the one or more bond pads 67 and/or the epitaxial layer 30 using known methods of semiconductor fabrication. These imaging components 70 may include charge-coupled device (CCD) components, CMOS imaging components, photodiodes, avalanche photodiodes, phototransistors, or other optoelectronic devices, in any combination. The imaging components 70 may include both CCD and CMOS components fabricated in separate areas of epitaxial layer 30 using known masking methods. Also included may be other electronic components such as CMOS transistors, bipolar transistors, capacitors, or resistors (not shown).

Figure 6:
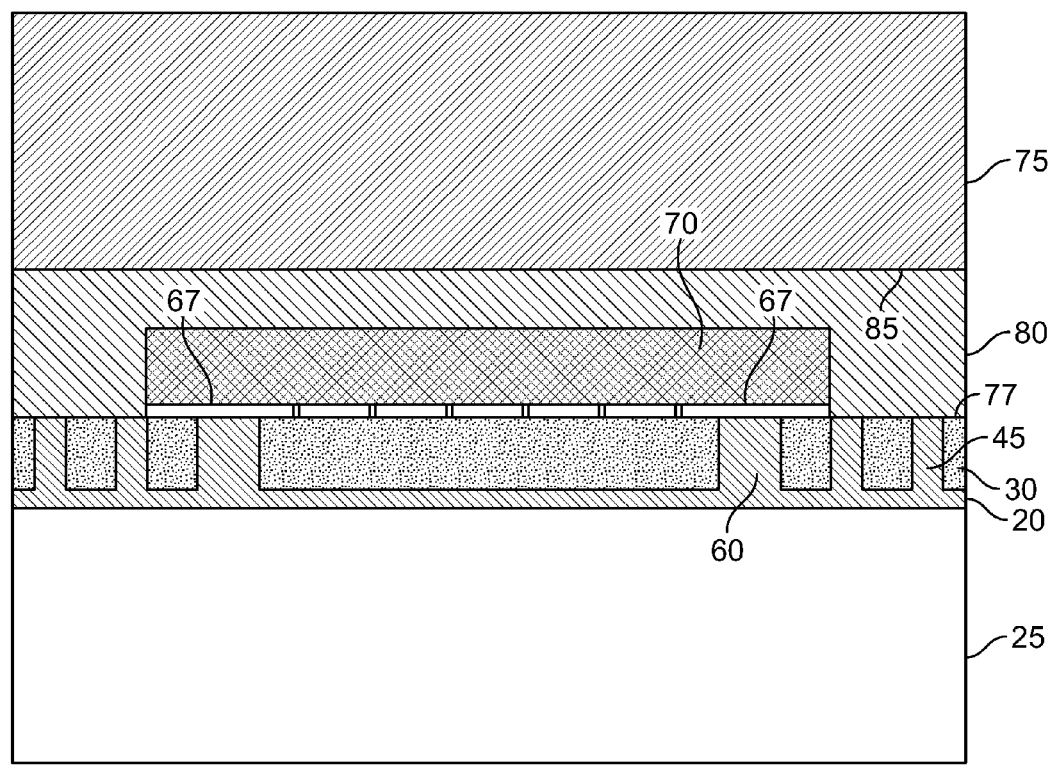
FIG. 6 shows the steps of fabricating a passivation layer produced by the steps illustrated in FIGS. 1-5, and bonding a second handle wafer to the front side of the device for providing further mechanical support.

Referring now to FIG. 6, further processing of components can be made to the back side of the device, necessitating the addition of a second handle wafer 75 to the front side 77 for providing further mechanical support. To add the second handle wafer 75 to the front side 77 of the imager, the imager is encapsulated by a passivation/dielectric layer 80. The passivation layer 80 is then polished using a chemical mechanical polishing process (CMP) to provide a flat surface 85 for the addition of the second handle wafer 75. The second handle wafer 75 is then attached or bonded to the flat surface 85 by one of several means. In one embodiment, the second handle wafer 75 is glued to the flat surface 85. In other embodiments, a handle wafer 75 made of pyrex glass is bonded to the flat surface 85 using anodic bonding.

Figure 7:
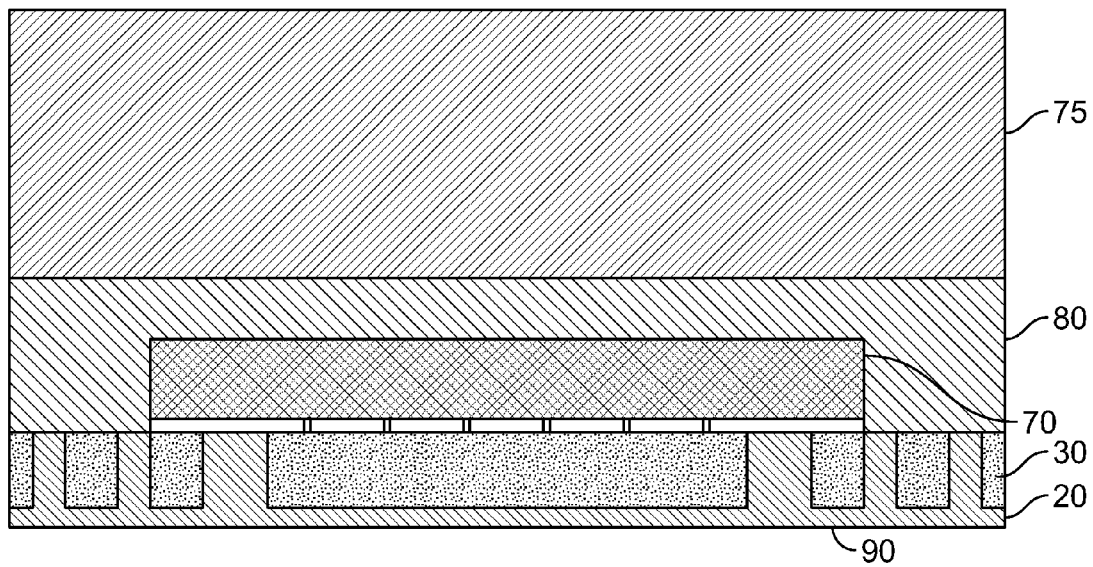
FIG. 7 shows the step of removing of the first handle wafer belonging to the initial SOI wafer of FIG. 1.
Figure 8:
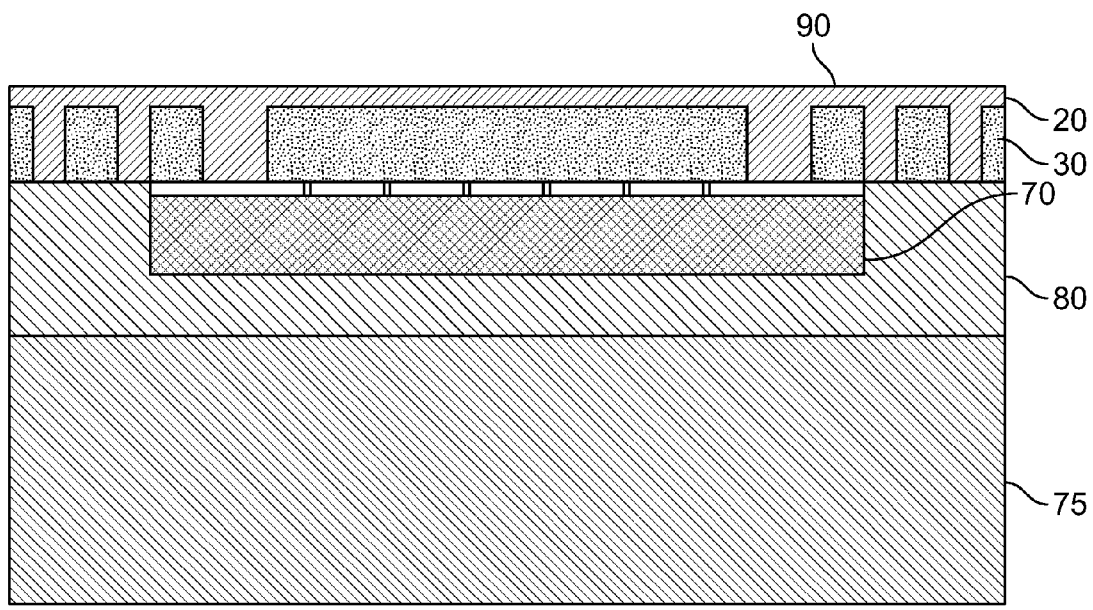
FIG. 8 shows the step of flipping the device over for further processing.

Referring to FIGS. 7 and 8, the next step of the process includes the removal of the first handle wafer 25. Handle wafer 25 is no longer needed to provide mechanical stability. Removal of handle wafer 25 may be accomplished by partial mechanical grinding followed by chemical etching, or a combination of these methods. With chemical etching, handle wafer 25 may be removed selectively, without removing insulator layer 20, to produce a smooth back side 90 of the imager. The insulating layer 20 acts as an etch stop layer. The imager is then flipped over (FIG. 8) for further processing.

Figure 9:
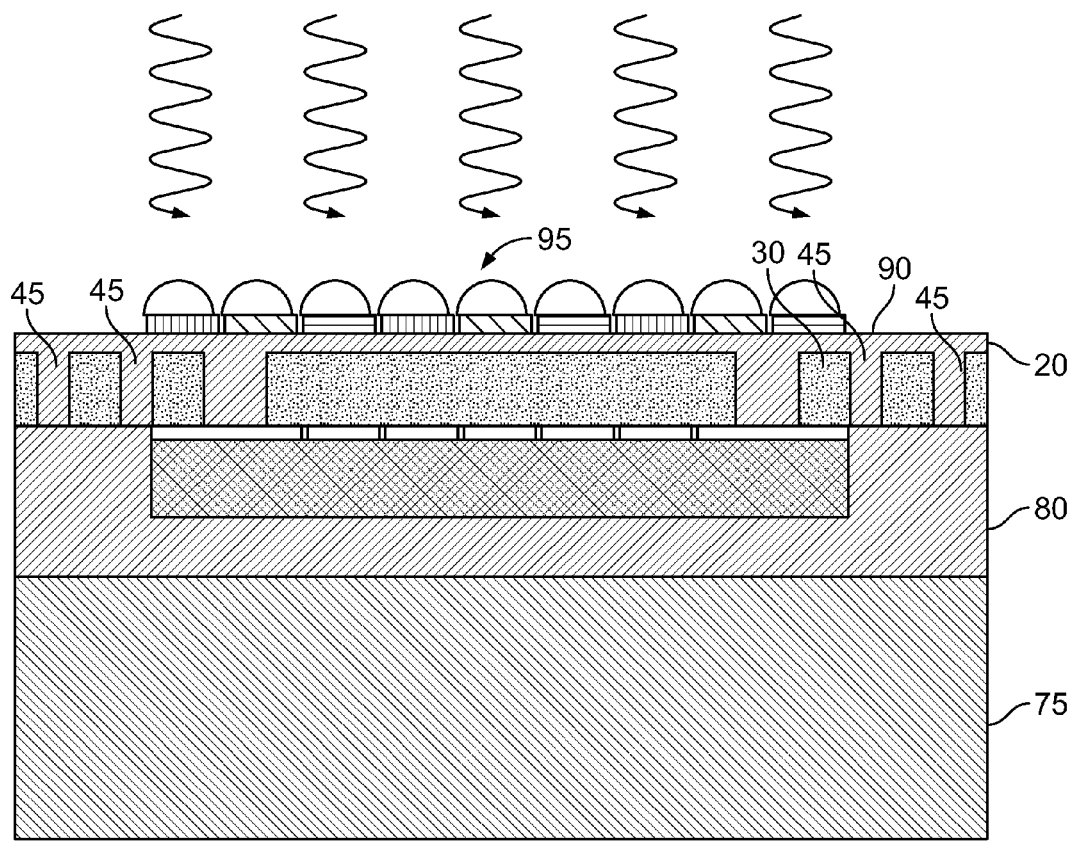
FIG. 9 shows the step of bonding optical components to the back side of the imager using the alignment keys as guides.

Referring now to FIG. 9, optical components 95 can be bonded to the back side 90 of the imager using the alignment keys 45 as precision guides. The one or more optical components can comprise color filters and micro-lenses to produce wavelength dependent signals.

Figure 10:
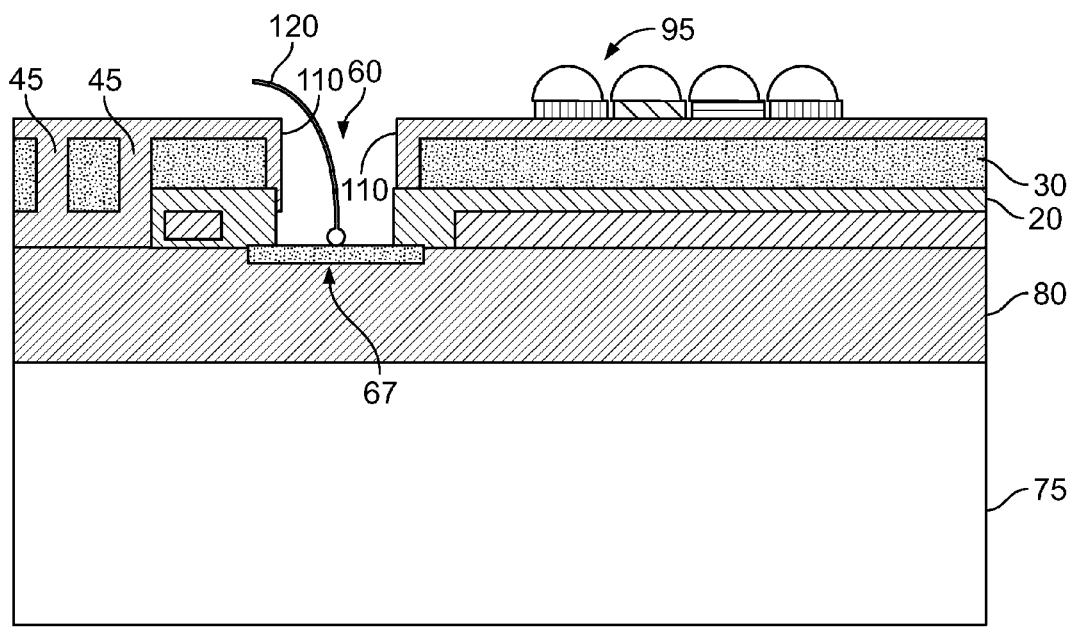
FIG. 10 shows the step of opening regions in bond pad regions to expose the bond pads and attaching bond wires to the bond pads.

Referring now to FIG. 10, a protective layer (not shown) is applied to the exposed portions of the optical components 95 to protect the optical components 95 from subsequent photo lithography steps. A photo resist is applied and, using photolithography, bond pad regions 60 directly overlying the bond pads 67 are opened. Silicon on the bond pad regions 60 is etched. Referring again to FIG. 4, trenches 57 were formed around these bond pad regions 60 and filled with oxide. Now, silicon in the region of the bond pad regions 60 is completely removed by anisotropy etch stopping on the oxide layer 20. This is followed by an oxide etch to etch the layer 20 stopping on the bond pad metal 67. A trench oxide etch follows which stops on the oxide/passivation/dielectric layer 80 below the bond pads 67. This etch leaves the side wall 110 to cover the epitaxial layer silicon and thereby protecting epitaxial layer 30 from the wire bonding process. At this point, the bond pads 67 are supported by the oxide/passivation/dielectric layer 80 followed by the second handle wafer 75. Wires 120 are bonded to the bond pads 67. The protective layer on top of the optical components 95 is removed.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. A semiconductor device, comprising:
an insulator layer
an epitaxial layer substantially overlying said insulator layer;
at least one bond pad region extending into said epitaxial layer to a surface of said insulator layer, the at least one bond pad region being formed in said insulator layer and said epitaxial layer, said bond pad region having an inner open region extending at least partially therethrough, thereby forming sidewalls in said at least one bond pad region;
at least one bond pad substantially overlying said bond pad region;
at least one component formed at least partially overlying and extending into said epitaxial layer; and
a passivation layer formed substantially overlying said epitaxial layer, said at least one component, and said at least one bond pad.

2. The semiconductor device of claim 1, further comprising a plurality of alignment keys formed at least partially overlying and extending into said epitaxial layer.

3. The semiconductor device of claim 2, wherein said alignment keys are filled with one of an oxide of silicon, silicon carbide, silicon nitride, and poly-silicon.

4. The semiconductor device of claim 1, wherein said epitaxial layer comprises silicon and the insulator layer comprises an oxide of silicon.

5. The semiconductor device of claim 1, wherein the at least one component at least partially overlying and extending into the epitaxial layer includes at least one of a CMOS imaging component, a charge-coupled device (CCD) component, a photodiode, an avalanche photodiode, and a phototransistor.

6. The semiconductor device of claim 1, further comprising at least one optical component bonded to said insulator layer.

7. The semiconductor device of claim 6, wherein the at least one optical component includes at least one of a color filter and a micro-lens.

8. The semiconductor device of claim 2, wherein said at least one bond pad is formed at a location in the epitaxial layer proximal to the alignment keys.

9. The semiconductor device of claim 1, further comprising a handle wafer bonded to said passivation layer, wherein pyrex glass is bonded between the passivation layer and the handle wafer.

10. The semiconductor device of claim 1, wherein the passivation layer is made of an oxide of silicon.

11. The semiconductor device of claim 1, further comprising a wire bonded to the at least one bond pad.

* * * * *